United States Patent
Rolfer et al.

(10) Patent No.: US 10,205,082 B2
(45) Date of Patent: Feb. 12, 2019

(54) CONSTRAINED PIEZO-ELECTRIC ELEMENT TO IMPROVE DRIVE CAPABILITY

(71) Applicant: Honeywell International Inc., Morris Plains, NJ (US)

(72) Inventors: Thomas J. Rolfer, Elk River, MN (US); Patrick Andrew Dorin, Eden Prairie, MN (US); Owen D. Grossman, Golden Valley, MN (US)

(73) Assignee: Honeywell International Inc., Morris Plains, NJ (US)

( * ) Notice: Subject to any disclaimer, the term of this patent is extended or adjusted under 35 U.S.C. 154(b) by 468 days.

(21) Appl. No.: 15/133,947

(22) Filed: Apr. 20, 2016

(65) Prior Publication Data

US 2017/0309809 A1    Oct. 26, 2017

(51) Int. Cl.
*H01L 41/09*    (2006.01)
*H01L 41/25*    (2013.01)

(52) U.S. Cl.
CPC ............ *H01L 41/094* (2013.01); *H01L 41/25* (2013.01)

(58) Field of Classification Search
CPC .............................. H01L 41/094; H01L 41/25
USPC .......................................... 310/328, 330–332
See application file for complete search history.

(56) References Cited

U.S. PATENT DOCUMENTS

| | | | |
|---|---|---|---|
| 4,691,212 | A | 9/1987 | Solcz et al. |
| 4,755,706 | A | 7/1988 | Harnden, Jr. et al. |
| 5,593,134 | A | 1/1997 | Steber et al. |
| 5,630,440 | A | 5/1997 | Knutson et al. |
| 6,041,652 | A | 3/2000 | Stewart |
| 6,748,177 | B1 | 6/2004 | Upton |

OTHER PUBLICATIONS

Yu, Xudong et al., "Parametric design of mechanical dither with bimorph piezoelectric actuator for ring laser gyroscope", Oct. 9, 2014, pp. 305-312, vol. 47, No. 2, Publisher: International Journal of Applied Electromagnetics and Mechanics.

*Primary Examiner* — Thomas Dougherty
(74) *Attorney, Agent, or Firm* — Fogg & Powers LLC

(57) ABSTRACT

A bendable apparatus is provided. The flexible material has a first-surface spanned by a first direction and a second direction. The bendable apparatus also includes a first-constraining surface one of: formed in the first-surface of the flexible material; or attached to the first-surface of the flexible material; and a piezo-electric element including a first-edge surface and a second-edge surface opposing the first-edge surface. The piezo-electric element is fixedly attached on the first-surface of the flexible material, so that: the first-edge surface and the second-edge surface are at least approximately perpendicular to the first-surface of the flexible material, and the first-constraining surface is adjacent to the first-edge surface of the piezo-electric element. When a voltage is applied to the piezo-electric element, the piezo-electric element expands in length, the first-edge surface of the piezo-electric element applies a force on the first-constraining surface, and the flexible material bends.

20 Claims, 11 Drawing Sheets

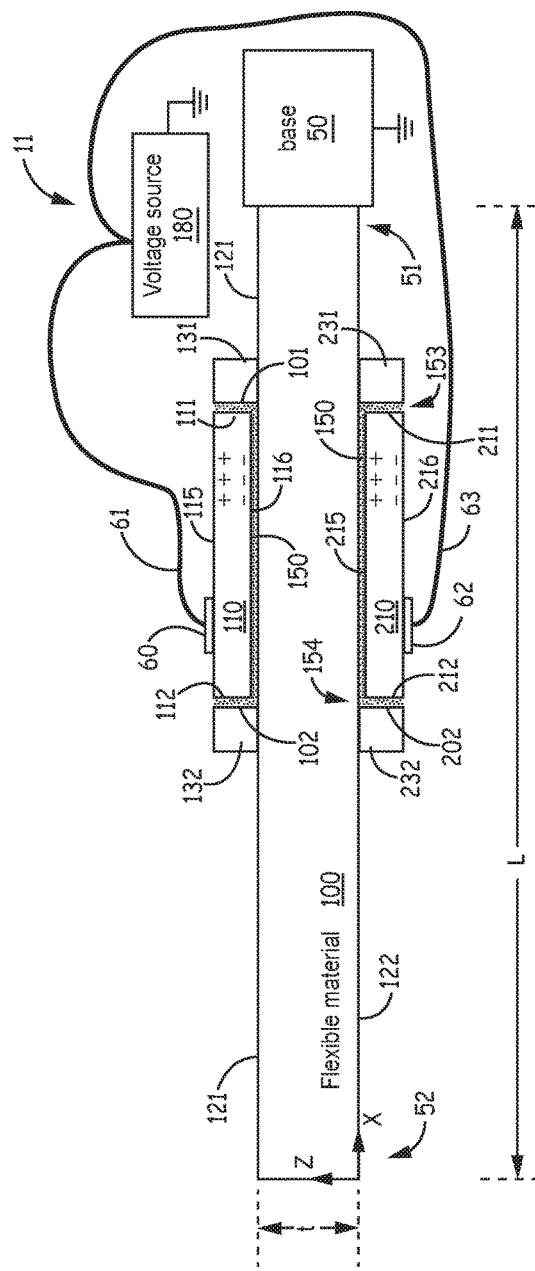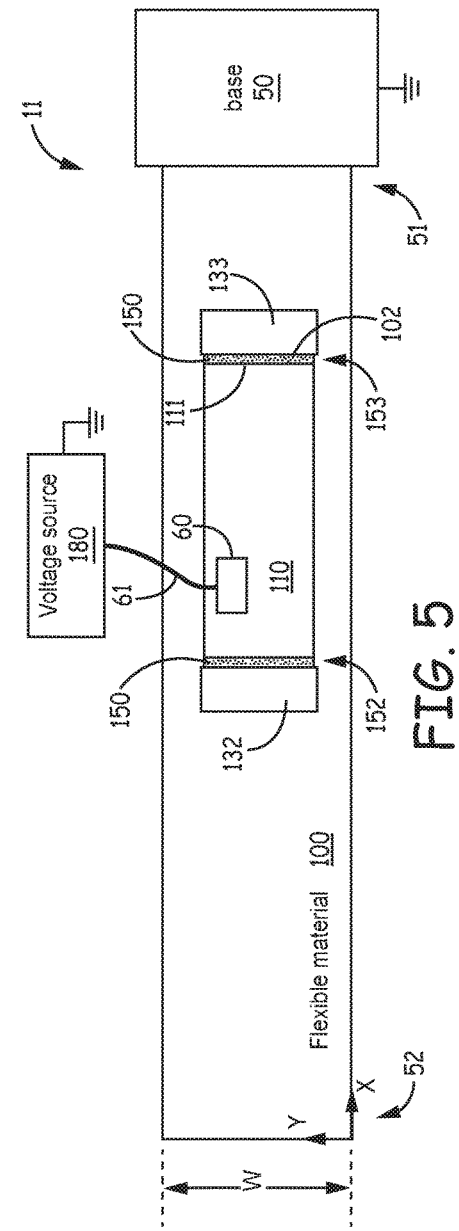

CONSTRAINED PIEZO-ELECTRIC ELEMENT TO IMPROVE DRIVE CAPABILITY

BACKGROUND

Dither reeds are used to dither (i.e., oscillate) components by small controllable amounts. Currently available dither reeds are flexed by attaching a piezo-electric element to the dither reed and applying a voltage to bend the dither reed. When the voltage is oscillated from positive to negative and back to positive, the dither reed oscillates. Similarly, the bending of cantilevered beams in micro-electro-mechanical systems (MEMS) is controlled applying a voltage to a piezo-electric element attached to the cantilevered beams.

SUMMARY

The present application relates to a bendable apparatus. The bendable apparatus includes a flexible material having a length in a first direction, a width in a second direction, and a thickness in a third direction. The length and the width are larger than the thickness. The flexible material has a first-surface spanned by the first direction and the second direction. The bendable apparatus also includes a first-constraining surface one of: formed in the first-surface of the flexible material; or attached to the first-surface of the flexible material; and a piezo-electric element including a first-edge surface and a second-edge surface opposing the first-edge surface. The piezo-electric element is fixedly attached on the first-surface of the flexible material, so that: the first-edge surface and the second-edge surface are at least approximately perpendicular to the first-surface of the flexible material, and the first-constraining surface is adjacent to the first-edge surface of the piezo-electric element. When a voltage is applied to the piezo-electric element, the piezo-electric element expands in length, the first-edge surface of the piezo-electric element applies a force on the first-constraining surface, and the flexible material bends.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 4 is a side view of an embodiment of a bendable apparatus in accordance with the present application;

FIG. 5 is a top view of the embodiment of the bendable apparatus of FIG. 4;

Figure 1:
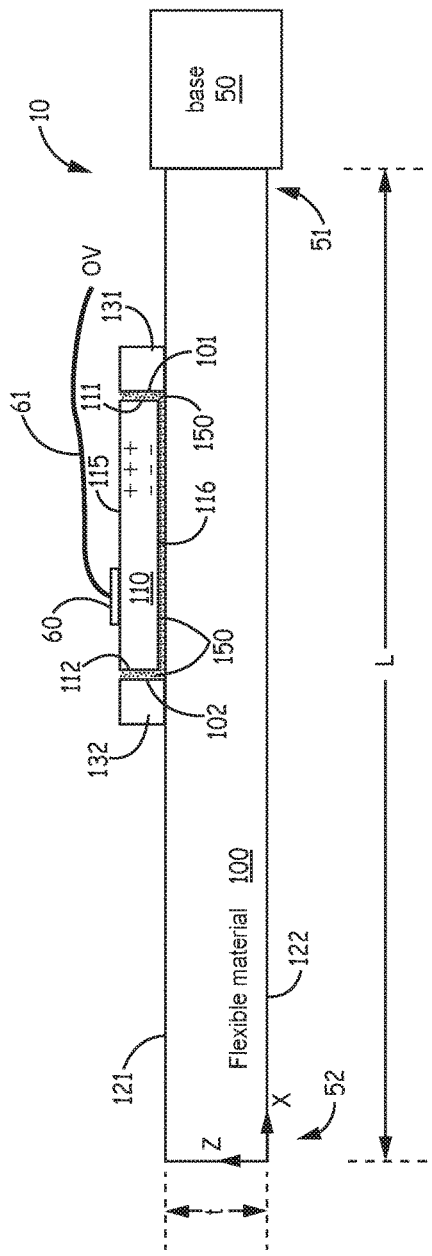
FIG. 1 is a side view of an embodiment of a bendable apparatus in accordance with the present application.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below provide a structure to provide a greater range of oscillation (over an original range of motion of a prior art apparatus) of a dither reed with the same amount of voltage or to decrease the voltage required to oscillate the dither reed through the original range of oscillation. A pocket is formed between opposing surfaces that extend from a surface of the dither reed or cantilevered beam. A piezo-electric element is positioned in the pocket and attached to a surface of the bendable material, such as a dither reed. When an applied voltage causes an expansion of the piezo-electric element, the edge surfaces of the piezo-electric element, which are adjacent to the surfaces extending from surface, push against the surfaces extending from surface. This provides an additional force to bend the dither reed or beam more than it would bend if the piezo-electric element were simply attached to the surface of the dither reed or beam as is done in prior art apparatuses.

Figure 2:
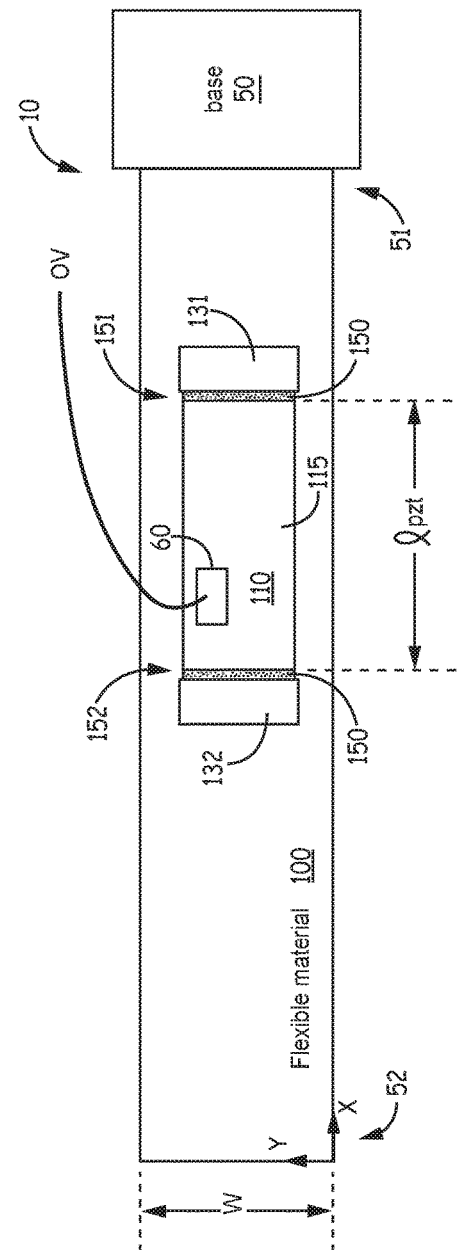
FIG. 2 is a top view of the embodiment of the bendable apparatus of FIG. 1.

FIG. 1 is a side view of an embodiment of a bendable apparatus 10 in accordance with the present application. FIG. 2 is a top view of the embodiment of the bendable apparatus 10 of FIG. 1. The bendable apparatus 10 includes a flexible material 100 having a length L in a first direction X, a width W in a second direction Y, and a thickness t in a third direction Z. The length L and the width W are larger than the thickness t. The flexible material 100 can be made from materials including, but not limited to, semiconductor materials, plastic, and metals, alloys of metal. In one implementation of this embodiment, the flexible material 100 is metal and the flexible material 100 flexible in the X-Y plane because the thickness of the flexible material 100 is so much smaller than the width W and length L of the flexible material 100.

The flexible material 100 includes a first-surface 121 and a second-surface 122 that are spanned by the first direction X and the second direction Y. The first-surface 121 and a second-surface 122 are in parallel X-Y planes that are offset from each other by the thickness t of the flexible material 100. The flexible material 100 is a cantilevered beam (in a fixed-free configuration) attached to a base 50 at a first end 51 of the flexible material 100 and free from any support at a second end 52 of the flexible material 100. In one implementation of this embodiment, both the first end 51 and the second end 52 are attached to a base as is structure described below with reference to FIG. 10.

As shown in FIGS. 1 and 2, two protrusions 131 and 132 extend from the first-surface 121 of the flexible material 100. In one implementation of this embodiment, only one protrusion (e.g., only protrusion 131 or only protrusion 132) extends from the first-surface 121. The two protrusions 131 and 132 formed in the first-surface 121 of the flexible material 100 or are attached to the first-surface 121 of the flexible material 100 to form an open-sided pocket for a first piezo-electric element 110. The first protrusion 131 has a first-constraining surface 101, which is at least approximately perpendicular to the first-surface 121. As defined herein, "at least approximately perpendicular" means the first-constraining surface 101 has a vertical component (in the Y-Z plane) that is perpendicular to the first-surface 121 and may have a much smaller horizontal component (in the X-Y plane) that is parallel to the first-surface 121. In one implementation of this embodiment, the first-constraining surface 101 is exactly perpendicular to the first-surface 121. In that case, the horizontal component (in the X-Y plane) that is parallel to the first-surface 121 is zero.

The second protrusion 132 has a second-constraining surface 102, which is at least approximately perpendicular to the first-surface 121 so the second-constraining surface 102 has a vertical component (in the Y-Z plane) that is perpendicular to the first-surface 121 and may have a much smaller horizontal component (in the X-Y plane) that is parallel to the first-surface 121. In one implementation of this embodiment, the second-constraining surface 102 is exactly perpendicular to the first-surface 121. The second-constraining surface 102 opposes the first-constraining surface 101. The second-constraining surface 102 is formed in the first-surface 121 of the flexible material 100 or is attached to the first-surface 121 of the flexible material 100. The second-constraining surface 102 and the first-constraining surface 101 are in parallel Y-Z planes that are offset from each other by the length $l_{pzt}$ of the piezo-electric element 110 plus the width (in the x direction) of gaps 151 and 152 (FIG. 2).

In one implementation of this embodiment, the two protrusions 131 and 132 are formed in the first-surface 121 of the flexible material 100 by milling down a portion of the first-surface 121 of the flexible material 100 so the two protrusions 131 and 132 remain. In another implementation of this embodiment, the two protrusions 131 and 132 are formed in the first-surface 121 of the flexible material 100 by photo-lithographically etching away a portion of the first-surface 121 so the two protrusions 131 and 132 remain. In yet another implementation of this embodiment, the two protrusions 131 and 132 are formed as supportive props, each having at least one ninety degree corner. In this case, supportive props 131 and 132 are attached with adhesive to the first-surface 121 so that the first-constraining surface 101 and the second-constraining surface 102 are approximately parallel to each other and are approximately perpendicular to the first-surface 121. If the first-constraining surface is attached to the flexible material, it is attached as part of a supportive prop (also referred to in the art as a "gusset" or "fillet feature") on a surface of the flexible material.

The piezo-electric element 110 includes a first-edge surface 111 and a second-edge surface 112 opposing the first-edge surface 111. The piezo-electric element is also referred to herein as a first piezo-electric element 110. The piezo-electric element 110 is fixedly attached on the first-surface 121 of the flexible material 100, so that: the first-edge surface 111 and the second-edge surface 112 are at least approximately perpendicular to the first-surface 121 of the flexible material 100; the first-constraining surface 101 is adjacent to the first-edge surface 111 of the piezo-electric element; and the second-constraining surface 102 is adjacent to the second-edge surface 112. In one implementation of this embodiment, adhesive 150 is used to attach the piezo-electric element 110 to the first-surface 120. As defined herein adjacent is very near or close. In one implementation of this embodiment, the widths of the gaps, which are measured in the X direction, are on the order of mils (1/1000 of an inch).

The piezo-electric element 110 is generally in a rectangular shape as shown in FIGS. 1 and 2. The piezo-electric element 110 includes a first surface 115 spanned by a first X-Y plane and a second surface 116 that is offset from the first surface 115 and that also spans (at least approximately) a second X-Y plane. Thus, the first surface 115 opposes the second surface 116. A first-edge surface 111 of piezo-electric element 110 is spanned by a first Y-Z plane. A second edge surface 112 of piezo-electric element 110 is spanned (at least approximately) by a second Y-Z plane. This technology will function even if the first surface 115 and the second surface 116 are not exactly parallel. This technology will function even if the first-edge surface 111 and the second-edge surface 112 are not exactly parallel. The greater the parallelism of the opposing surfaces, the greater the force exerted when a voltage is applied to the piezo-electric element 110.

A first gap 151 between the first-constraining surface 101 and the first-edge surface 111 of the first piezo-electric element 110 is filled with a filler 150. A second gap 152 between the second-constraining surface 102 and the second-edge surface 112 of the of the first piezo-electric element 110 is filled with filler 150. In one implementation of this embodiment, the filler is an adhesive material. In this case, if the length $l_{pzt}$ of the piezo-electric element 110 contracts, the first-constraining surface 101 and the second-constraining surface 102 are pulled, via the adhesive 150, toward each other by an amount that equals the change in the length $\Delta l_{pzt}$ of the $l_{pzt}$ of the piezo-electric element 110.

It is possible for the bending apparatuses described herein to operate without fill 150 in the gaps 151 and 152. However, since the expansion of the piezo-electric element is measured in micro-inches, the constraints on the length of the piezo-electric element 110 and the constraints on the positions of the first-constraining surface 101 and the second-constraining surface 102 would be severe. This would add to the fabrication cost of the bending apparatus.

The first piezo-electric element 110 has a first-positive side 115 and a first-negative side 116 opposing the first-positive side 115. As shown in FIG. 1, the first-negative side 116 is fixedly attached to the first-surface 121 of the flexible material 100. An electrode 60 is attached to the first-positive side 115 of the first piezo-electric element 110. In another implementation of this embodiment, the first-positive side 115 is fixedly attached to the first-surface 121 of the flexible material 100 and electrode 60 is attached to the first-negative side 116 of the first piezo-electric element 110.

It is to be noted that there is gap between the piezo-electric element and the first-constraining surface of the supportive prop but when gap is filled with a filler (such as adhesive), the piezo-electric element is mechanically coupled to the first-constraining surface.

Figure 3A:
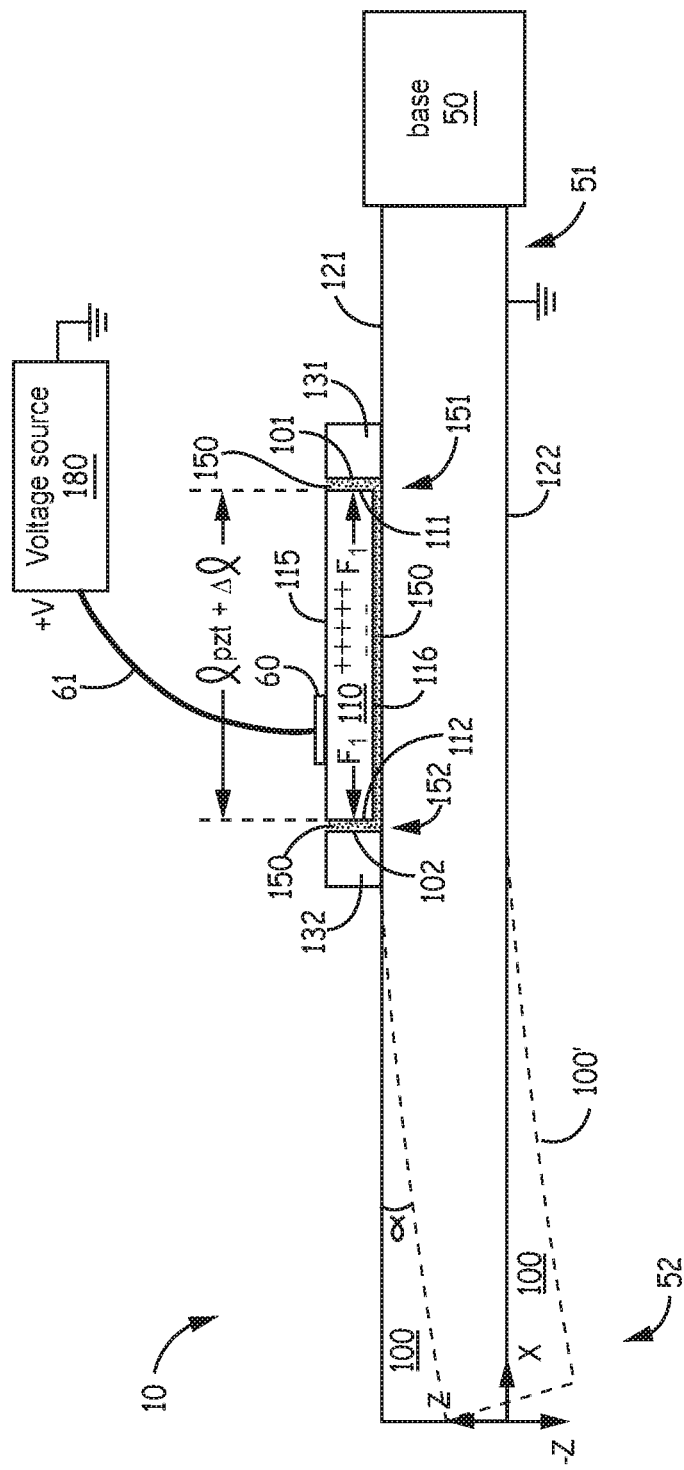
FIG. 3A is a side view of the embodiment of the bendable apparatus of FIG. 1 being bent by the application of a positive voltage.
Figure 3B:
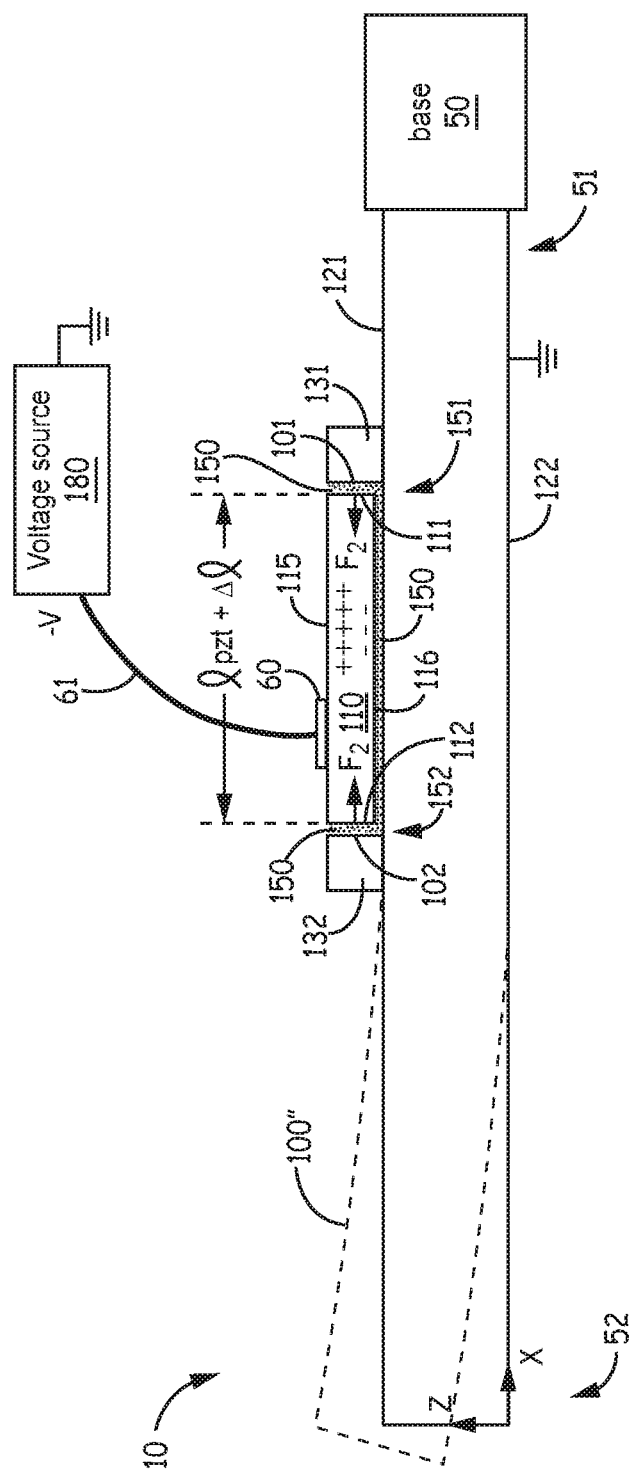
FIG. 3B is a side view of the embodiment of the bendable apparatus of FIG. 1 being bent by the application of a negative voltage.

FIG. 3A is a side view of the embodiment of bendable apparatus 10 of FIG. 1 being bent by the application of a positive voltage +V. FIG. 3B is a side view of the embodiment of the bendable apparatus of FIG. 1 being bent by the application of a negative voltage −V. As shown in FIGS. 3A and 3B, the voltage source 180 is connected to ground and the second-surface 122 is connected to ground. The relative position of the bent flexible material 100 is shown by the dashed outline represented generally at 100' and 100" in FIGS. 3A and 3B, respectively. In FIG. 3A, an angle α is shown between the unbent flexible material 100 and the bent flexible material 100'.

As is known in the art, when a voltage is applied to the piezo-electric element, the piezo-electric element expands or contracts in length depending on the polarity of the voltage and the side of the piezo-electric element to which the voltage is applied. As shown in FIG. 3A, a positive voltage +V is applied to the first-positive side 115 of the piezo-electric element 110 from a voltage source 180 via a trace line represented generally at 61 and the electrode 60. In one implementation of this embodiment, the electrode 60 covers the first-positive side 115 of the piezo-electric element 110. In this case, the first-positive side 115 of the piezo-electric element 110 is coated with a metal or metal alloy. Responsive to the positive voltage +V applied to the first-positive side 115, the of the piezo-electric element 110 expands in length from $l_{pzt}$ to $(l_{pzt}+\Delta l)$. The first-edge surface 111 of the piezo-electric element 110 applies a force $F_1$ on the first-constraining surface 101 and the second-edge surface 112 of the piezo-electric element 110 applies a $F_1$ on the second-constraining surface 102. Due to the combined forces $2F_1$, the flexible material 100 bends more than it would if the piezo-electric element were only attached by adhesive to the first-surface 121 (as is done in prior art apparatuses). As shown in FIG. 3A, the bending pushes the unattached end 52 of the flexible material 100 in the negative Z direction. If both the first end 51 and the second end 52 are attached to a base, when bent, the first-surface 121 and second-surface 122 are bent with a radius of curvature that is approximately centered on the center of the piezo-electric element 110 and that is concave away from the piezo-electric element 110 (i.e., the piezo-electric element 110 outside of the concave region of the bent surface).

In one implementation of this embodiment, the apparatus 10 does not include a second protrusion 132 and there is not second-constraining surface 102 to provide a force $F_1$. In such an embodiment, the applied force $F_1$ due to the first-edge surface 111 of the piezo-electric element 110 pushes on the first-constraining surface 101, the flexible material 100 bends more than it would if the piezo-electric element 110 were only attached by adhesive to the first-surface 121 (as is done in prior art apparatuses).

As shown in FIG. 3B, a negative voltage −V is applied to the first-positive side 115 of the from a voltage source 180 via a trace line represented generally at 61 and the electrode 60. Responsive to this negative voltage applied to the piezo-electric element 110, the piezo-electric element 110 contracts in length from $l_{pzt}$ to $(l_{pzt}-\Delta l)$. If the filler 150 is an adhesive, the first-edge surface 111 of the piezo-electric element 110 applies a pulling force $F_2$ on the first-constraining surface 101 and the second-edge surface 112 of the piezo-electric element 110 applies a pulling force $F_2$ on the second-constraining surface 102. Due to the combined forces $2F_2$, the flexible material 100 bends more than it would if the piezo-electric element were only attached by adhesive to the first-surface 121 (as is done in prior art apparatuses). As shown in FIG. 3B, the bending pulls the unattached end 52 of the flexible material 100 in the positive Z direction. If both the first end 51 and the second end 52 are attached to a base, when bent, the first-surface 121 and second-surface 122 are bent with a radius of curvature that is approximately centered on the center of the piezo-electric element 110 and that is concave toward the piezo-electric element 110 (i.e., the piezo-electric element 110 is in the concave region of the bent surface).

When the voltage applied is switched between a positive voltage +V and a negative voltage −V, the flexible material 100 moves back and forth with the period of the switching.

Figure 6:
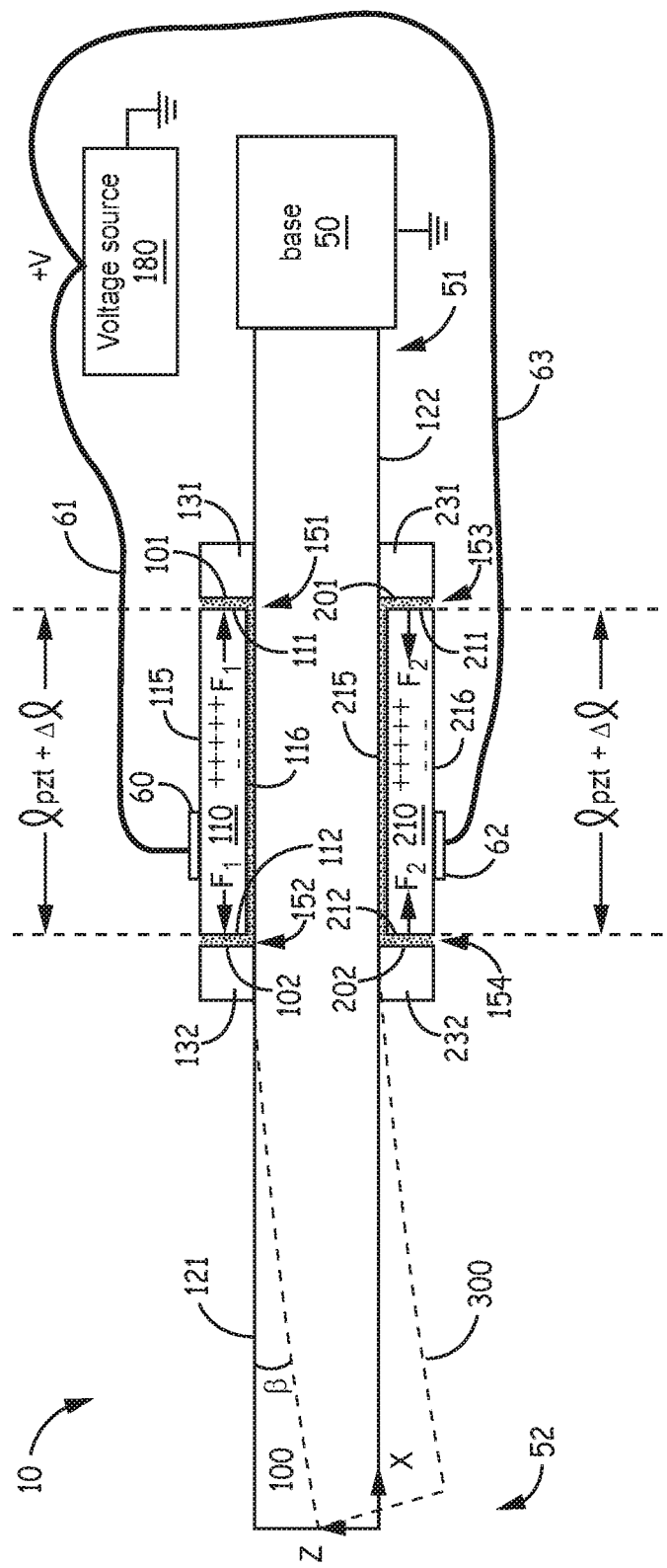
FIG. 6 is a side view of the embodiment of the bendable apparatus of FIG. 1 being bent by the application of a positive voltage.

FIG. 4 is a side view of an embodiment of a bendable apparatus 11 in accordance with the present application. FIG. 5 is a top view of the embodiment of the bendable apparatus 11 of FIG. 4. FIG. 6 is a side view of the embodiment of the bendable apparatus of FIG. 1 being bent by the application of a positive voltage +V. The bendable apparatus 11 differs from the bendable apparatus 10 in that a second piezo-electric element 210 is fixedly attached on the second-surface 122 of the flexible material 100 and two protrusions 231 and 232 extend from the second-surface 122 of the flexible material 100. In one implementation of this embodiment, only one protrusion (e.g., only protrusion 231 or only protrusion 232) extends from the second-surface 122.

The bendable apparatus 11 includes a flexible material 100 that is similar in structure and function to the flexible material 100 described above with reference to FIGS. 1-3B. The protrusions 231 and 232 are similar in function and structure to the protrusions 131 and 132 described above with reference to FIGS. 1-3B. The protrusions 231 and 232 are formed in the manner that protrusions 131 and 132 are formed as described above with reference to FIGS. 1-3B.

The bendable apparatus 11 includes a third-constraining surface 201 that is formed, as part of the protrusion 231, in the second-surface 122 of the flexible material 100 or that is part of the protrusion 231 that is attached to the second-surface 122. The bendable apparatus 11 also includes a fourth-constraining surface 202 that is formed in the second-surface 122 of the flexible material 100 or is attached to the second-surface 122 of the flexible material 100. The bendable apparatus 11 includes a first-constraining surface 101 and a second-constraining surface 102 opposing the first-constraining surface 101 as described above with reference to FIGS. 1-3B.

The second piezo-electric element 210 is similar in structure and function to the first piezo-electric element 110 described above with reference to FIGS. 1-3B. Specifically, the second piezo-electric element 210 includes a third-edge surface 211 and a fourth-edge surface 212 opposing the third-edge surface 211, and includes a second-positive side 215 and a second-negative side 216 opposing the second-positive side 215. As shown in FIG. 6, the second-positive side 215 fixedly attached on the second-surface 122 of the flexible material 100, so that the third-edge surface 211 and the fourth-edge surface 212 are at least approximately perpendicular to the second-surface 122 of the flexible material 100. The third-constraining surface 201 is adjacent to the third-edge surface 211 of the second piezo-electric element 210, and the fourth-constraining surface 202 is adjacent to the fourth-edge surface 212 of the second piezo-electric element 210.

Filler 150 fills a first gap 151 between the first-constraining surface 101 and the first-edge surface 111 of the first piezo-electric element 110. Filler 150 fills a second gap 152 between the second-constraining surface 102 and the second-edge surface 112 of the of the first piezo-electric element 110. Filler 150 fills a third gap 153 between the third-constraining surface 201 and the third-edge surface 211 of the second piezo-electric element 210. Filler 150 fills a fourth gap 154 between the fourth-constraining surface 202 and the fourth-edge surface 212 of the second piezo-electric element 210. In one implementation of this embodiment, the filler 150 is an adhesive 150. In another implementation of this embodiment, the adhesive 150 used to fill the gaps 151-152 is the same as the adhesive 150 used to attach the first piezo-electric element 110 to the first-surface 121. In yet another implementation of this embodiment, the adhesive 150 used to fill the gaps 153-154 is the same as the adhesive 150 used to attach the second piezo-electric element 110 to the second-surface 122.

When a voltage (e.g., positive voltage +V) is applied to the first piezo-electric element 110 and the second piezo-electric element 210, as shown in FIG. 6, the first piezo-electric element 110 expands in length from $l_{pzt}$ to $(l_{pzt}+\Delta 1)$ while the second-surface 122 second piezo-electric element 210 contracts in length from $l_{pzt}$ to $(l_{pzt}-\Delta 1)$. The forces $F_1$ on the first-constraining surface 101 and the second-constraining surface 102 function as described above with reference to FIGS. 3A and 3B.

The third-constraining surface 201, which is attached to the adjacent to the third-edge surface 211 of the second-piezo-electric element 210, is pulled by the force $F_2$ toward the fourth-constraining surface 202, which is also pulled by the $F_2$ toward the third-constraining surface 201. Due to the combined forces $2F_2$, the flexible material 100 bends more than it would if only the first piezo-electric element 110 were attached to the flexible material 100 and received an applied voltage. The relative position of the bent flexible material 100 is shown by the dashed outline represented generally at 101 in FIG. 6. The angle β, shown in FIG. 6 between the unbent flexible material 100 and the bent flexible material 300 is greater than the angle α, shown in FIG. 3A, between the unbent flexible material 100 and the bent flexible material 100'.

Figure 7:
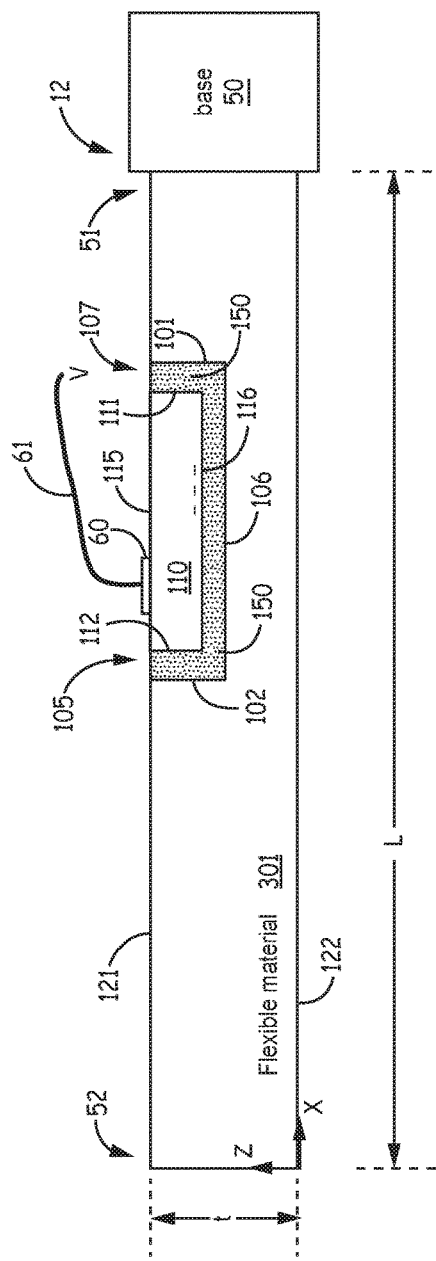
FIG. 7 is a side view of an embodiment of bendable apparatus in accordance with the present application.
Figure 8:
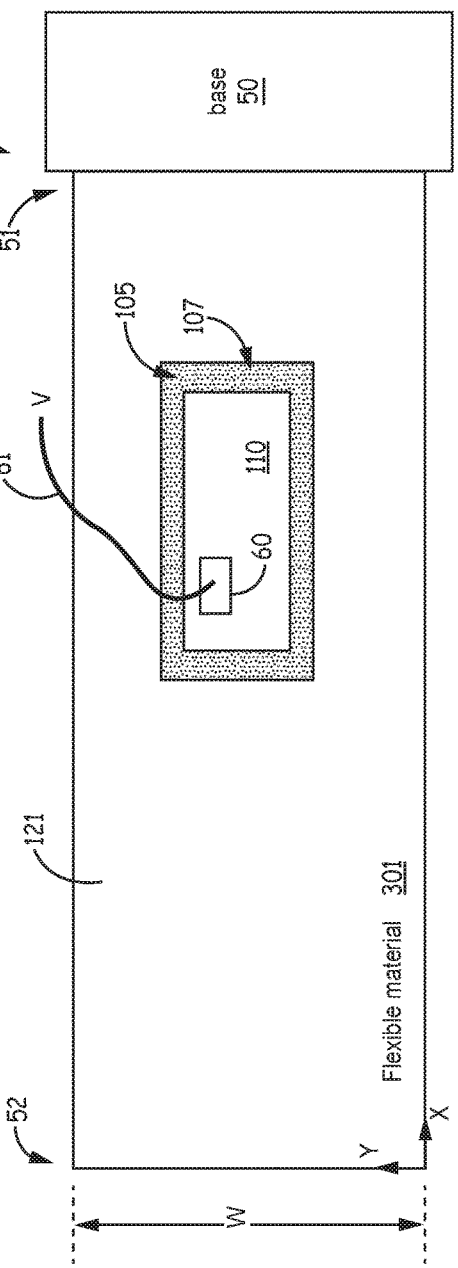
FIG. 8 is a top view of the embodiment of the bendable apparatus of FIG. 7.

There are other ways of providing a first-constraining surface and second-constraining surface on the flexible material 100 as is shown in FIGS. 7 and 8. FIG. 7 is a side view of an embodiment of a bendable apparatus 12 in accordance with the present application. FIG. 8 is a top view of the embodiment of the bendable apparatus 12 of FIG. 7. In the bendable apparatus 12, a cavity 105 is formed in the first-surface 121 of the flexible material 301. The first piezo-electric element 110 is attached with filler 150 (e.g., adhesive 150) in the cavity 105. In this manner, the first-constraining surface 101 and the second-constraining surface 102 are opposing surfaces of a cavity 105 formed in the first-surface 121 of the flexible material 301. The first-surface 106 of the flexible material 301 to which the piezo-electric element 110 is attached is a cavity surface 106 of the cavity 105. The cavity surface 105 opposes an opening 107 of the cavity. When a voltage is applied to the first piezo-electric element 110 that is attached to the flexible material 301 in the cavity 105, the piezo-electric element 110 expands or contracts so the flexible material 301 is bent in the manner described above with reference to FIGS. 1-6.

In one implementation of this embodiment, a cavity formed in the second-surface 122 and a second piezo-electric element 210 is attached to a cavity surface of the second cavity. In this manner, a third-constraining surface 201 and a fourth-constraining surface 202 opposing the third-constraining surface 201 are formed in the flexible material 301 as is understandable to one skilled in the art upon reading and understanding this document.

Figure 9:
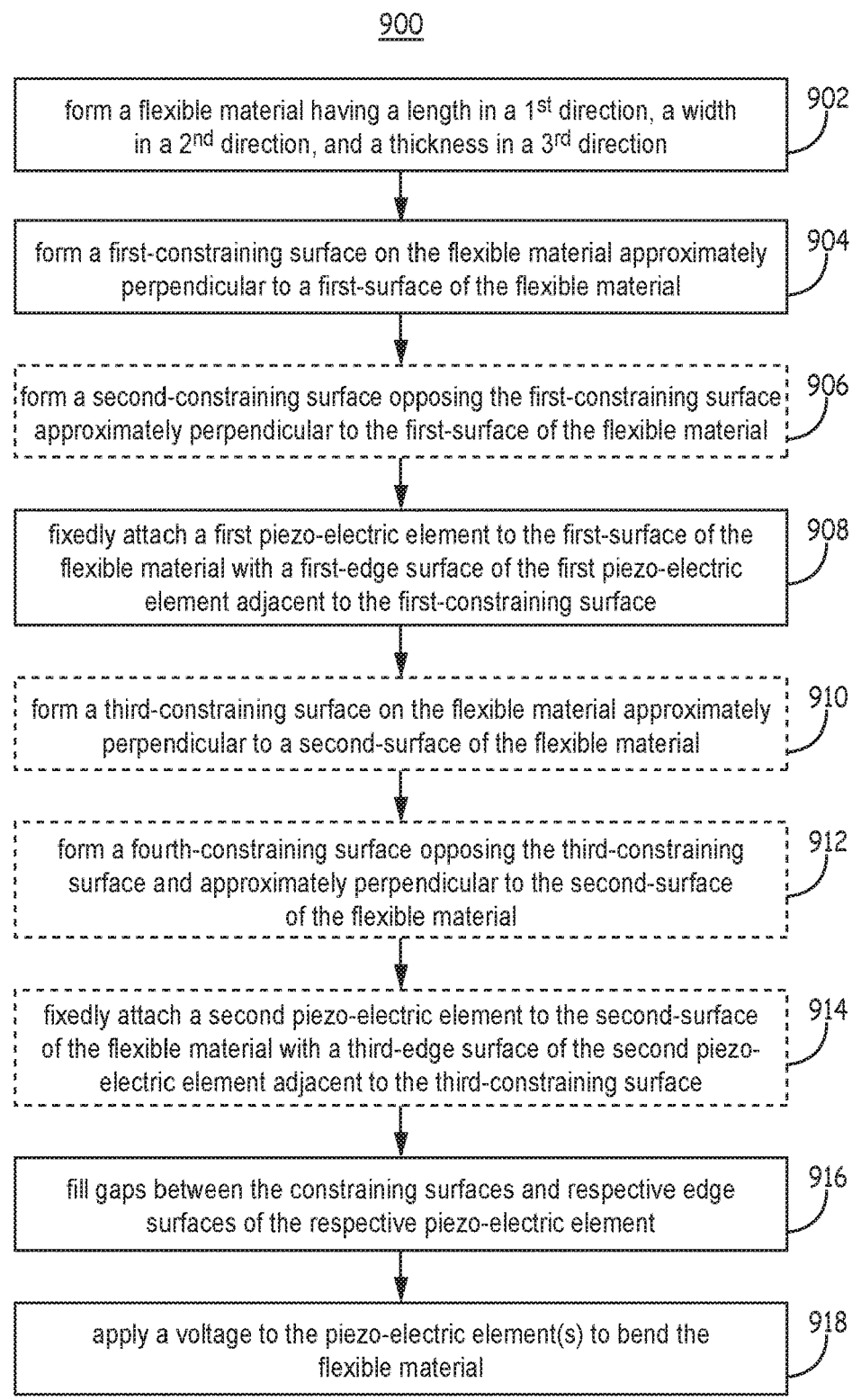
FIG. 9 is an embodiment of a method of forming a bendable apparatus in accordance with the present application.

FIG. 9 is an embodiment of a method 900 of forming a bendable apparatus 100 in accordance with the present application. Method 900 is applicable to the bending apparatuses 10, 11, and 12 described above with reference to FIGS. 1-8. Method 900 is also applicable to the bending apparatuses described below with reference to FIGS. 10-13.

At block 902, a flexible material 100 is formed having a length L in a first direction X, a width W in a second direction Y, and a thickness t in a third direction Z. The length L and the width W are larger than the thickness t. The flexible material 100 has a first-surface 121 spanned by the first direction, X and the second direction, Y. In one implementation of this embodiment, the flexible material is a metal. In another implementation of this embodiment, the flexible material is a semiconductor cantilever in a MEMS device. In yet another implementation of this embodiment, the flexible material is a silicon cantilever for MEMS device. In yet another implementation of this embodiment, the flexible material is a plastic material.

At block 904, a first-constraining surface 101 is formed in the flexible material 100. The first-constraining surface 101 is at least approximately perpendicular to the first-surface 121 of the flexible material 100. In one implementation of this embodiment, the first-constraining surface 101 is formed by etching the first-surface 121 of the flexible material 100 while masking a portion of the first-surface 121 where the protrusions 131 and/or 132 are to be formed. In another implementation of this embodiment, the first-constraining surface 101 is formed by etching a cavity 105 the first-surface 121 of flexible material 100. One skilled in the art knows how to etch protrusions and cavities in the flexible material 100.

At block 906, a second-constraining surface 102 is optionally formed opposing the first-constraining surface 101. The second-constraining surface 102 is at least approximately perpendicular to the first-surface 121 of the flexible material 100. If the second-constraining surface 102 is formed, it will typically be formed at the same time as the first-constraining surface 101 is formed. If the first-constraining surface 101 is formed by etching a cavity 105 the first-surface 121 of flexible material 100, the second-surface 102 is automatically formed. The cavity 105 is also referred to as pocket.

At block 908, a piezo-electric element 110 is fixedly attached to the first-surface 121 of the flexible material 100. The piezo-electric element 110 includes a first-edge surface 111 and a second-edge surface 112 opposing the first-edge surface 111. When the piezo-electric element 110 is attached to the first-surface 121, the first-edge surface 111 of the piezo-electric element 110 is adjacent to the first-constraining surface 101 and the second-edge surface 112 of the piezo-electric element 110 is adjacent to the second-constraining surface 102. The first-edge surface 111 and the second-edge surface 112 are at least approximately perpendicular to the first-surface 121 of the flexible material 100. In one implementation of this embodiment, the first piezo-electric element 110 is fixedly attached to the first-surface 121 with an adhesive 150.

At block 910, a third-constraining surface 201 is optionally formed in a second-surface 122 of the flexible material 100. The third-constraining surface 201 is at least approximately perpendicular to the second-surface 122 of the flexible material 100.

At block 912, a fourth-constraining surface 202, which opposes the third-constraining surface 201, is optionally formed. The fourth-constraining surface 202 is at least approximately perpendicular to the second-surface 122 of the flexible material 100.

At block 914, a second piezo-electric element 210 is (optionally) fixedly attached to the second-surface 122 of the flexible material 100. The process at block 914 occurs if the process at blocks 910 and/or 912 occurs. The second piezo-electric element 210 includes a third-edge surface 211 and a fourth-edge surface 212 opposing the third-edge surface 211. When the second piezo-electric element 210 is attached to the second-surface 122, the third-edge surface 211 of the second piezo-electric element 210 is adjacent to the third-constraining surface 201 and the fourth-edge surface 212 of the second piezo-electric element 210 is adjacent to the fourth-constraining surface 202. The third-edge surface 211 and the fourth-edge surface 212 are at least approximately perpendicular to the second-surface 122 of the flexible material 100. In one implementation of this embodiment, the second piezo-electric element 210 is fixedly attached to the second-surface 122 with an adhesive 150.

At block 916, gaps (e.g., gaps 151-154 shown in FIG. 4) are filled with a filler 150. In one implementation of this embodiment, the filler 150 is an adhesive 150. The process at block 916 includes one or more of: filling a first gap 151 between the first-constraining surface 101 and the first-edge surface 111 of the first piezo-electric element 110; filling a second gap 152 between the second-constraining surface 102 and the second-edge surface 112 of the of the first piezo-electric element 110; filling a third gap 153 between the third-constraining surface 201 and the third-edge surface 211 of the second piezo-electric element 210; and filling a third gap 153 between the third-constraining surface 201 and the fourth-edge surface 212 of the second piezo-electric element 210. The bendable apparatus is formed as described in process steps 902-916.

At block 918, after the bendable apparatus is formed, the bendable apparatus is used by applying a voltage to the first piezo-electric element 110 and/or the second piezo-electric element 210 to bend the flexible material 100.

FIGS. 1-8 show embodiments of bendable apparatuses that are cantilevered beams in a fixed-free configuration. FIGS. 10-13 show a plurality of bendable apparatuses, which are a respective plurality of dither reeds arranged in a fixed-fixed configuration for use with a respective plurality of gyroscopes. FIGS. 10-13 show embodiment of bendable apparatuses, which are dither reeds used to rotate gyroscopes or other sensors.

Figure 10:
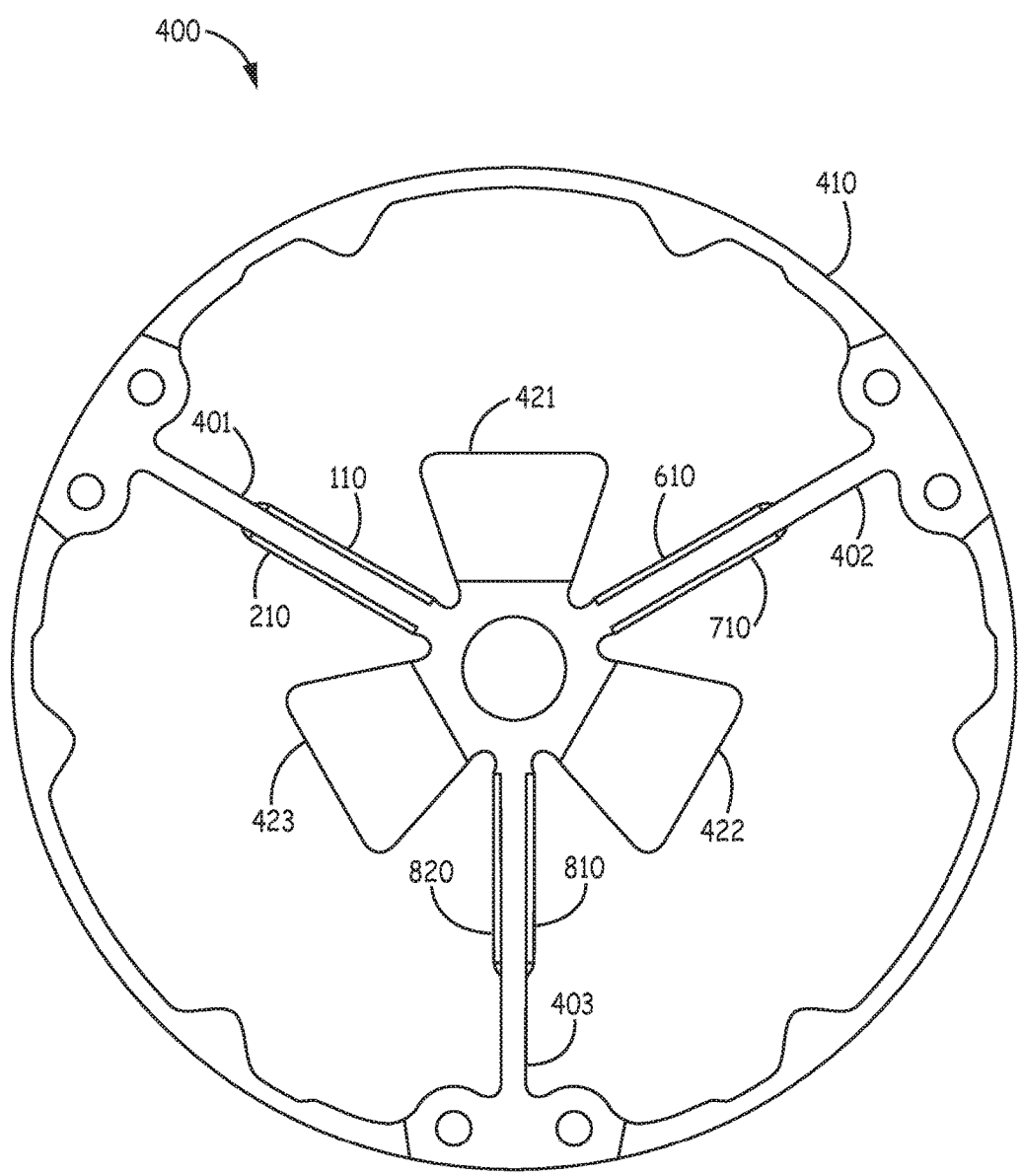
FIG. 10 is a top view of an embodiment of a plurality of bendable apparatuses in accordance with the present application, the bendable apparatuses arranged in a structure configured hold a plurality of gyroscopes.

FIG. 10 is a top view of an embodiment of a plurality of bendable apparatuses 401, 402, and 403 in accordance with the present application. The plurality of bendable apparatuses 401, 402, and 403 are in a structure 400. The structure 400 includes an outer frame 410, the bendable apparatuses 401, 402, and 403, a first plate 421, a second plate 422, and a third plate 423. The first plate 421, the second plate 422, and the third plate 423 are mounting blocks for three respective sensors, such as three gyroscopes. The bendable apparatuses 401, 402, and 403 are attached at both ends in a fixed-fixed configuration.

The first and second piezo-electric elements 110 and 210 are on opposing surfaces of a first bendable apparatus 401. A third piezo-electric element 610 and a fourth piezo-electric element 710 are on opposing surfaces of a second bendable apparatus 402. A fifth piezo-electric element 810 and a sixth piezo-electric element 820 are on opposing surfaces of a third bendable apparatus 403. The bendable apparatuses 401, 402, and 403 are connected at one end to the outer structure 410.

Figure 11:
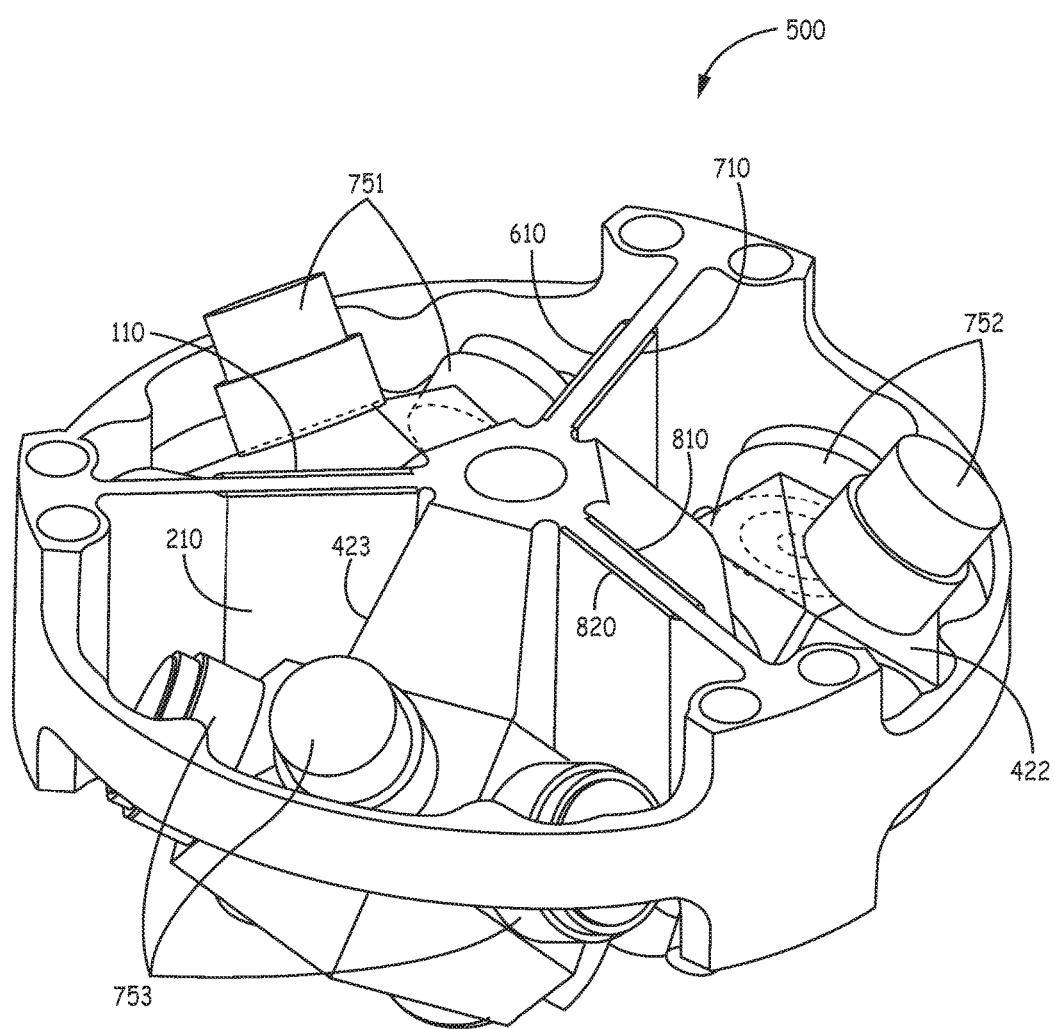
FIG. 11 is an oblique view of the embodiment of the plurality of bendable apparatuses of FIG. 10 in which a plurality of gyroscopes are attached to the structure.

FIG. 11 is an oblique view of the embodiment of the plurality of bendable apparatuses 401, 402, and 403 of FIG. 10 in which a plurality of gyroscopes 751, 752, 753 are attached to the structure. Specifically the gyroscopes 751, 752, 753 are attached to the plates 421, 422, and 423, respectively. The bendable apparatuses 401, 402, and 403 are connected at the other end to a ring from which the first plate 421, the second plate 422, and the third plate 423 extend.

The first plate 421 is arranged between the first bendable apparatus 401 and the second bendable apparatus 402. The second plate 422 is arranged between the second bendable apparatus 402 and the third bendable apparatus 403. The third plate 423 is arranged between the third bendable apparatus 403 and the first bendable apparatus 401. The first plate 421, the second plate 422, and the third plate 423 are configured to hold a plurality of gyroscopes 751, 752, 753 as shown in FIG. 11.

Figure 12:
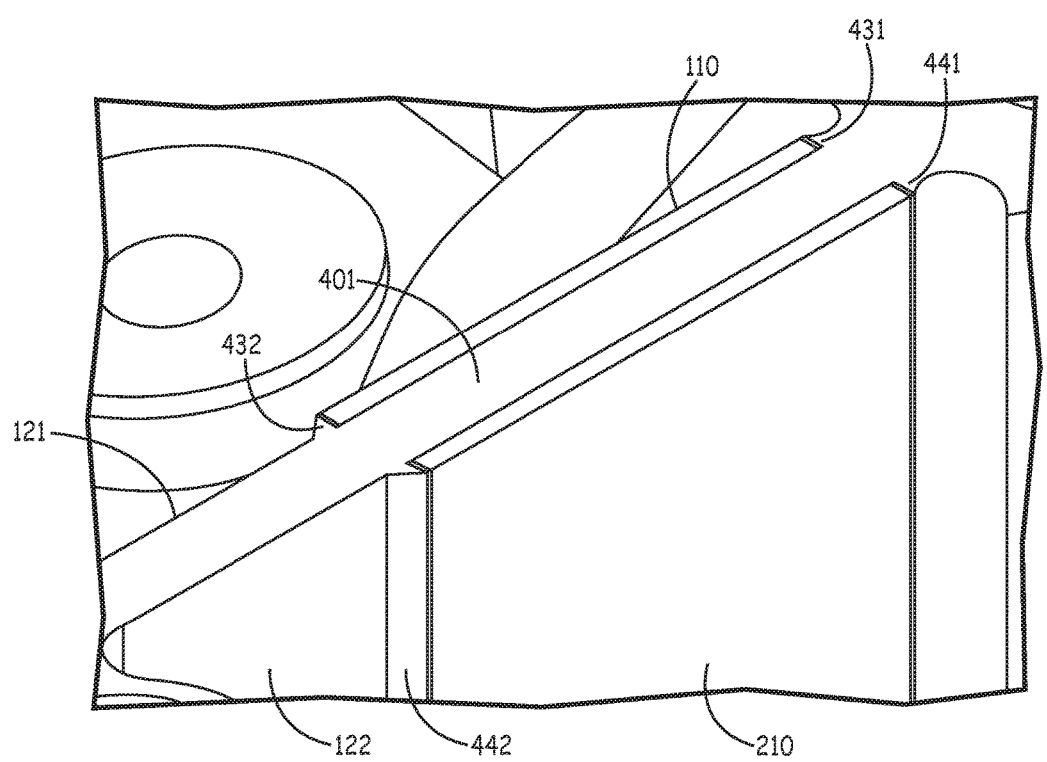
FIG. 12 is an enlarged oblique view of one of the bendable apparatuses of FIG. 10.

FIG. 12 is an enlarged oblique view of one of the bendable apparatuses 401 of FIG. 10. As shown in FIG. 12, the protrusions 431 and 432 extend from the first-surface 121 and the first piezo-electric element 110 is attached to the first-surface 121 between the protrusions 431 and 432 so the bendable apparatus 401 functions as described above. As shown in FIG. 12, the protrusions 441 and 442 extend from the second-surface 122 and the second piezo-electric element 210 is attached to the second-surface 122 between the protrusions 441 and 442 so the bendable apparatus 401 functions as described above.

Figure 13:
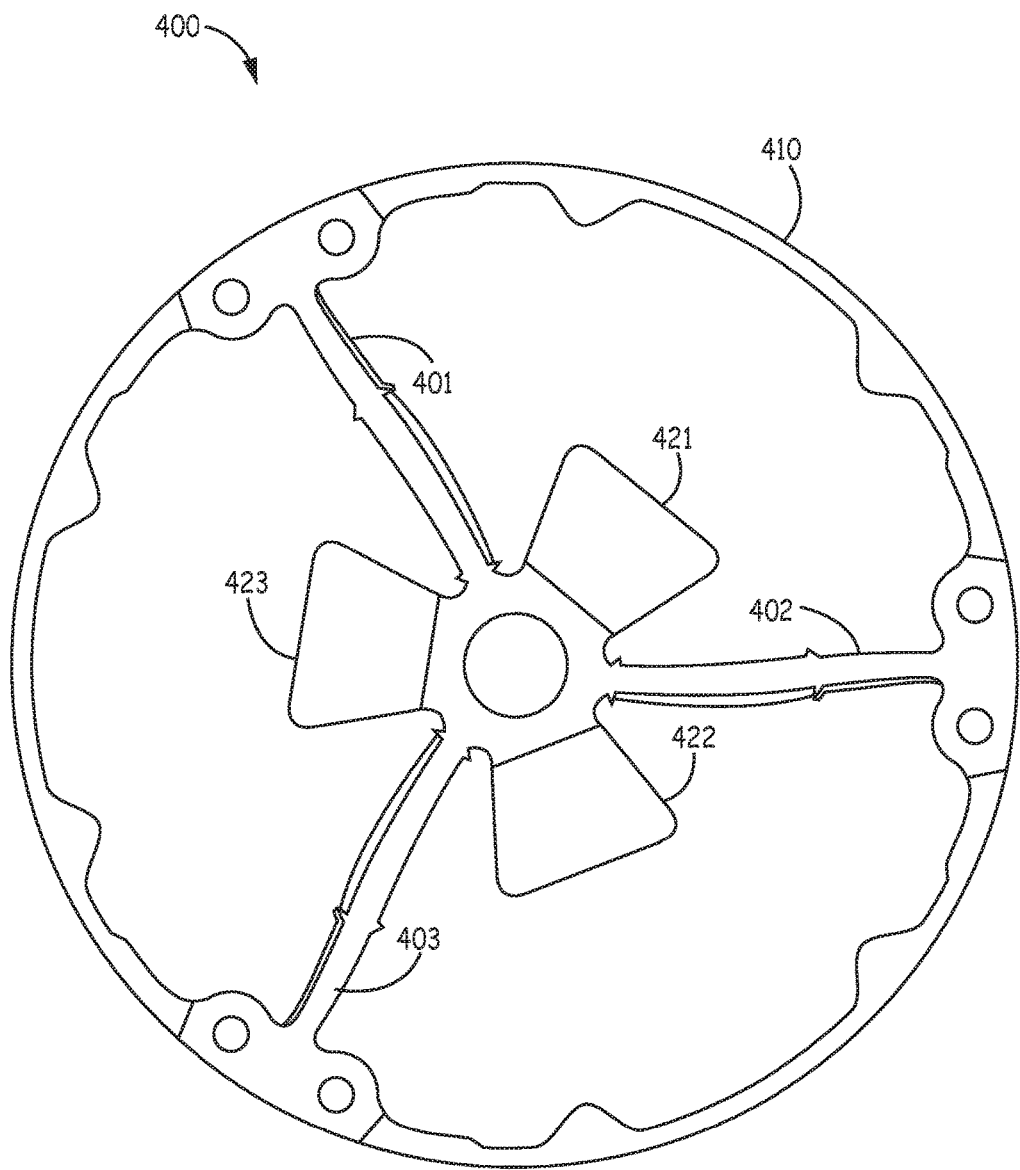
FIG. 13 is a top view of the embodiment of a plurality of bendable apparatuses of FIG. 10, the bendable apparatuses arranged in a structure configured hold a plurality of gyroscopes.

FIG. 13 is a top view of the embodiment of a plurality of bendable apparatuses 401, 403, and 403 of FIG. 10, the bendable apparatuses arranged in a structure 410 configured hold a plurality of gyroscopes. As shown in FIG. 13, a voltage is applied to: the piezo-electric elements 110, 210 on the bendable apparatus 401;

In this manner the plurality of bendable apparatuses 401, 403, and 403 are bent or flexed. If the gyroscopes (or other sensors) are attached to the plates 421, 422, 423, the gyroscopes (or other sensors) rotate responsive to the motion of the bendable apparatuses 401, 403, and 403.

The bendable apparatuses 10, 11, 12, 401, 402, and 403 described herein advantageously bend (flex) further for the same voltage applied to a prior art bendable apparatus. Alternately, a lower voltage can be applied to the bendable apparatuses 10, 11, 12, 401, 402, and 403 described herein to obtain the same amount of bending (flexing) as obtained by a prior art bendable apparatus with a higher voltage.

In one implementation of this embodiment, the flexible material is a metal. In another implementation of this embodiment, the flexible material is a semiconductor cantilever in a MEMS device. In yet another implementation of this embodiment, the flexible material is a silicon cantilever for MEMS device. In yet another implementation of this embodiment, the flexible material is a plastic material. One skilled in the art knows how to etch protrusions and cavities in any of these materials. One skilled in the art knows how to select the proper adhesive material to attach a supportive prop to any of these materials. In yet another implementation of this embodiment, the piezo-electric element is molded into a cavity in the bendable material.

Example Embodiments

Example 1 includes a bendable apparatus, comprising: a flexible material having a length in a first direction, a width in a second direction, and a thickness in a third direction, wherein the length and the width are larger than the thickness, the flexible material having a first-surface spanned by the first direction and the second direction; a first-constraining surface one of: formed in the first-surface of the flexible material; or attached to the first-surface of the flexible material; and a piezo-electric element including a first-edge surface and a second-edge surface opposing the first-edge surface, the piezo-electric element fixedly attached on the first-surface of the flexible material, so that: the first-edge surface and the second-edge surface are at least approximately perpendicular to the first-surface of the flexible material, and the first-constraining surface is adjacent to the first-edge surface of the piezo-electric element, wherein, when a voltage is applied to the piezo-electric element, the piezo-electric element expands in length, the first-edge surface of the piezo-electric element applies a force on the first-constraining surface, and the flexible material bends.

Example 2 includes the bendable apparatus of Example 1, wherein the force on the first-constraining surface is a first force on the first-constraining surface, the bendable apparatus further comprising: a second-constraining surface opposing the first-constraining surface, the second-constraining surface one of: formed in the first-surface of the flexible material; or attached to the first-surface of the flexible material, the second-constraining surface adjacent to the second-edge surface of the piezo-electric element, wherein, when a voltage is applied to the piezo-electric element, the second-edge surface of the piezo-electric element applies a second force on the second-constraining surface.

Example 3 includes the bendable apparatus of Example 2, wherein the piezo-electric element is a first piezo-electric element having a first-positive side and a first-negative side opposing the first-positive side, wherein the first-negative side of the first piezo-electric element is fixedly attached on the first-surface of the flexible material, and wherein the flexible material includes a second-surface opposing the first-surface, the bendable apparatus further including: a third-constraining surface one of: formed in the second-surface of the flexible material; or attached to the second-surface of the flexible material; and a second piezo-electric element including a third-edge surface, and including a second-positive side and a second-negative side, the second-positive side fixedly attached on the second-surface of the flexible material, the third-constraining surface adjacent to the third-edge surface of the second-piezo-electric element, wherein, when the voltage is applied to the second piezo-electric element, the second piezo-electric element contracts in length causing the flexible material to bend further.

Example 4 includes the bendable apparatus of Example 3, further comprising: filler filling a first gap between the first-constraining surface and the first-edge surface of the first piezo-electric element; filler filling a second gap between the second-constraining surface and the second-edge surface of the of the first piezo-electric element; and filler filling a third gap between the third-constraining surface and the third-edge surface of the second piezo-electric element.

Example 5 includes the bendable apparatus of any of Examples 2-4, further comprising: filler filling a first gap between the first-constraining surface and the first-edge surface; and filler filling a second gap between the second-constraining surface and the second-edge surface.

Example 6 includes the bendable apparatus of any of Examples 2-5, wherein the first-constraining surface and the second-constraining surface are surfaces on two respective protrusions extending from the first-surface of the flexible material.

Example 7 includes the bendable apparatus of any of Examples 2-6, wherein the first-constraining surface and the second-constraining surface are opposing surfaces of a cavity formed in the first-surface of the flexible material, wherein the first-surface of the flexible material to which the piezo-electric element is attached is a cavity surface of the cavity, the cavity surface opposing an opening of the cavity.

Example 8 includes the bendable apparatus of any of Examples 2-7, wherein the first-constraining surface and the second-constraining surface are surfaces on two respective supportive props attached to the first-surface of the flexible material.

Example 9 includes the bendable apparatus of any of Examples 1-8, wherein the piezo-electric element is a first piezo-electric element having a first-positive side and a first-negative side opposing the first-positive side, wherein the first-negative side of the first piezo-electric element is fixedly attached on the first-surface of the flexible material, and wherein the flexible material includes a second-surface opposing the first-surface, the bendable apparatus further including: another constraining surface one of: formed in the second-surface of the flexible material; or attached to the second-surface of the flexible material; and a second piezo-electric element having a second-positive side and a second-negative side, the second-positive side fixedly attached on the second-surface of the flexible material, the second-constraining surface adjacent to a third-edge surface of the second-piezo-electric element, wherein, when the voltage is applied to the second piezo-electric element, the second piezo-electric element contracts in length causing the flexible material to bend further.

Example 10 includes the bendable apparatus of Example 9, further comprising: filler filling a first gap between the first-constraining surface and the first-edge surface of the first piezo-electric element; and filler filling a second gap between the other constraining surface and the first-edge surface of the second piezo-electric element.

Example 11 includes the bendable apparatus of any of Examples 1-10, wherein the flexible material includes a plurality of dither reeds arranged in conjunction with a respective plurality of gyroscopes.

Example 12 includes a method of forming a bendable apparatus, the method comprising: forming a flexible material having a length in a first direction, a width in a second direction, and a thickness in a third direction, wherein the length and the width are larger than the thickness, the flexible material having a first-surface spanned by the first direction and the second direction; forming a first-constraining surface in the flexible material, wherein the first-constraining surface is at least approximately perpendicular to the first-surface of the flexible material; and fixedly attaching a piezo-electric element, which includes a first-edge surface and a second-edge surface opposing the first-edge surface, to the first-surface of the flexible material, wherein the first-edge surface of the piezo-electric element is adjacent to the first-constraining surface, wherein the first-edge surface and the second-edge surface are at least approximately perpendicular to the first-surface of the flexible material, and wherein, when a voltage is applied to the piezo-electric element, the piezo-electric element expands in length, the first-edge surface of the piezo-electric element applies a force on the first-constraining surface, and the flexible material bends.

Example 13 includes the method of Example 12, further comprising: filling a gap between the first-constraining surface and the first-edge surface with filler.

Example 14 includes the method of any of Examples 12-13, further comprising: forming a second-constraining surface opposing the first-constraining surface, wherein the second-constraining surface is at least approximately perpendicular to the first-surface of the flexible material, wherein the second-constraining surface is adjacent to the second-edge surface of the piezo-electric element, and wherein, when the voltage is applied to the piezo-electric element, the second-edge surface of the piezo-electric element applies another force on the second-constraining surface, and the flexible material bends further.

Example 15 includes the method of Example 14, wherein the piezo-electric element is a first piezo-electric element having a first-positive side and a first-negative side opposing the first-positive side, wherein fixedly attaching the piezo-electric element to the first-surface of the flexible material comprises fixedly attaching the first-negative side of the first piezo-electric element to the first-surface of the flexible material, the method further comprising: forming a third-constraining surface in a second-surface of the flexible material, wherein the third-constraining surface is at least approximately perpendicular to the second-surface of the flexible material; and fixedly attaching a second piezo-electric element to the second-surface of the flexible material, wherein the second piezo-electric element includes: a third-edge surface and a fourth-edge surface opposing the third-edge surface; and a second-positive side and a second-negative side opposing the second-positive side, wherein the third-edge surface of the second piezo-electric element is adjacent to the third-constraining surface, wherein the second-positive side of the second piezo-electric element is fixedly attached on the second-surface of the flexible material, and wherein, when the voltage is applied to the second piezo-electric element, the second piezo-electric element contracts in length.

Example 16 includes the method of Example 15, further comprising: forming a fourth-constraining surface opposing the third-constraining surface, wherein the fourth-constraining surface is at least approximately perpendicular to the second-surface of the flexible material, wherein the fourth-constraining surface is adjacent to the fourth-edge surface of the second piezo-electric element fixedly attached to the second-surface of the flexible material.

Example 17 includes the method of any of Examples 12-16, wherein the piezo-electric element is a first piezo-electric element having a first-positive side and a first-negative side opposing the first-positive side, wherein fixedly attaching the piezo-electric element to the first-surface of the flexible material comprises fixedly attaching the first-negative side of the first piezo-electric element to the first-surface of the flexible material, the method further comprising: fixedly attaching a second piezo-electric element to a second-surface of the flexible material, wherein the second piezo-electric element includes: a first-edge surface and a second-edge surface opposing the first-edge surface; and a second-positive side and a second-negative side opposing the second-positive side, wherein the second-positive side of the second piezo-electric element is fixedly attached on the second-surface of the flexible material, and wherein, when the voltage is applied to the second piezo-electric element, the second piezo-electric element contracts in length.

Example 18 includes the method of Example 17, further comprising: filling a first gap between the first-constraining surface and the first-edge surface of the first piezo-electric element; filling a second gap between the second-constraining surface and the second-edge surface of the of the first piezo-electric element; filling a third gap between the third-constraining surface and the third-edge surface of the second piezo-electric element; and filling a third gap between the third-constraining surface and the fourth-edge surface of the second piezo-electric element.

Example 19 includes a bendable apparatus comprising: a flexible material having a length in a first direction, a width in a second direction, and a thickness in a third direction, wherein the length and the width are larger than the thickness, the flexible material having a first-surface spanned by the first direction and the second direction and a second-surface spanned by the first direction and the second direction; a first-constraining surface one of: formed in the first-surface of the flexible material; or attached to the first-surface of the flexible material; a second-constraining surface opposing the first-constraining surface, the second-constraining surface one of: formed in the first-surface of the flexible material; or attached to the first-surface of the flexible material; a third-constraining surface one of: formed in the second-surface of the flexible material; or attached to the second-surface of the flexible material; a fourth-constraining surface one of: formed in the second-surface of the flexible material; or attached to the second-surface of the flexible material; a first piezo-electric element including a first-edge surface and a second-edge surface opposing the first-edge surface, and including a first-positive side and a first-negative side opposing the first-positive side, the first-negative side of the first piezo-electric element fixedly attached on the first-surface of the flexible material, so that: the first-edge surface and the second-edge surface are at least approximately perpendicular to the first-surface of the flexible material, and the first-constraining surface is adjacent to the first-edge surface of the first piezo-electric element, and the second-constraining surface is adjacent to the second-edge surface of the first piezo-electric element; and a second piezo-electric element including a third-edge surface and a fourth-edge surface opposing the third-edge surface, and including a second-positive side and a second-negative side opposing the second-positive side, the second-positive side fixedly attached on the second-surface of the flexible material, so that: the third-edge surface and the fourth-edge surface are at least approximately perpendicular to the second-surface of the flexible material, and the third-constraining surface is adjacent to the third-edge surface of the second piezo-electric element, and the fourth-constraining surface is adjacent to the fourth-edge surface of the second piezo-electric element wherein, when a voltage is applied to the first piezo-electric element and the second piezo-electric element, the first piezo-electric element expands in length and the second piezo-electric element contracts in length, wherein the first-edge surface of the piezo-electric element applies a first force on the first-constraining surface, the second-edge surface of the piezo-electric element applies a second force on the second-constraining surface, and wherein the applied voltage causes the flexible material to bend.

Example 20 includes the bendable apparatus of Example 19, further comprising: filler filling a first gap between the first-constraining surface and the first-edge surface of the first piezo-electric element; filler filling a second gap between the second-constraining surface and the second-edge surface of the of the first piezo-electric element; filler filling a third gap between the third-constraining surface and the third-edge surface of the second piezo-electric element;

and filler filling a fourth gap between the fourth-constraining surface and the fourth-edge surface of the second piezo-electric element.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A bendable apparatus, comprising:
   a flexible material having a length in a first direction, a width in a second direction, and a thickness in a third direction, wherein the length and the width are larger than the thickness, the flexible material having a first-surface spanned by the first direction and the second direction;
   a first-constraining surface one of: formed in the first-surface of the flexible material; or attached to the first-surface of the flexible material; and
   a piezo-electric element including a first-edge surface and a second-edge surface opposing the first-edge surface, the piezo-electric element fixedly attached on the first-surface of the flexible material, so that:
   the first-edge surface and the second-edge surface are at least approximately perpendicular to the first-surface of the flexible material, and
   the first-constraining surface is adjacent to the first-edge surface of the piezo-electric element,
   wherein, when a voltage is applied to the piezo-electric element, the piezo-electric element expands in length, the first-edge surface of the piezo-electric element applies a force on the first-constraining surface, and the flexible material bends.

2. The bendable apparatus of claim 1, wherein the force on the first-constraining surface is a first force on the first-constraining surface, the bendable apparatus further comprising:
   a second-constraining surface opposing the first-constraining surface, the second-constraining surface one of: formed in the first-surface of the flexible material; or attached to the first-surface of the flexible material, the second-constraining surface adjacent to the second-edge surface of the piezo-electric element, wherein, when a voltage is applied to the piezo-electric element, the second-edge surface of the piezo-electric element applies a second force on the second-constraining surface.

3. The bendable apparatus of claim 2, wherein the piezo-electric element is a first piezo-electric element having a first-positive side and a first-negative side opposing the first-positive side, wherein the first-negative side of the first piezo-electric element is fixedly attached on the first-surface of the flexible material, and wherein the flexible material includes a second-surface opposing the first-surface, the bendable apparatus further including:
   a third-constraining surface one of: formed in the second-surface of the flexible material; or attached to the second-surface of the flexible material; and
   a second piezo-electric element including a third-edge surface, and including a second-positive side and a second-negative side, the second-positive side fixedly attached on the second-surface of the flexible material, the third-constraining surface adjacent to the third-edge surface of the second-piezo-electric element, wherein, when the voltage is applied to the second piezo-electric element, the second piezo-electric element contracts in length causing the flexible material to bend further.

4. The bendable apparatus of claim 3, further comprising:
   filler filling a first gap between the first-constraining surface and the first-edge surface of the first piezo-electric element;
   filler filling a second gap between the second-constraining surface and the second-edge surface of the of the first piezo-electric element; and
   filler filling a third gap between the third-constraining surface and the third-edge surface of the second piezo-electric element.

5. The bendable apparatus of claim 2, further comprising:
   filler filling a first gap between the first-constraining surface and the first-edge surface; and
   filler filling a second gap between the second-constraining surface and the second-edge surface.

6. The bendable apparatus of claim 2, wherein the first-constraining surface and the second-constraining surface are surfaces on two respective protrusions extending from the first-surface of the flexible material.

7. The bendable apparatus of claim 2, wherein the first-constraining surface and the second-constraining surface are opposing surfaces of a cavity formed in the first-surface of the flexible material, wherein the first-surface of the flexible material to which the piezo-electric element is attached is a cavity surface of the cavity, the cavity surface opposing an opening of the cavity.

8. The bendable apparatus of claim 2, wherein the first-constraining surface and the second-constraining surface are surfaces on two respective supportive props attached to the first-surface of the flexible material.

9. The bendable apparatus of claim 1, wherein the piezo-electric element is a first piezo-electric element having a first-positive side and a first-negative side opposing the first-positive side, wherein the first-negative side of the first piezo-electric element is fixedly attached on the first-surface of the flexible material, and wherein the flexible material includes a second-surface opposing the first-surface, the bendable apparatus further including:
   another constraining surface one of: formed in the second-surface of the flexible material; or attached to the second-surface of the flexible material; and
   a second piezo-electric element having a second-positive side and a second-negative side, the second-positive side fixedly attached on the second-surface of the flexible material, the second-constraining surface adjacent to a third-edge surface of the second-piezo-electric element, wherein, when the voltage is applied to the second piezo-electric element, the second piezo-electric element contracts in length causing the flexible material to bend further.

10. The bendable apparatus of claim 9, further comprising:
    filler filling a first gap between the first-constraining surface and the first-edge surface of the first piezo-electric element; and
    filler filling a second gap between the other constraining surface and the first-edge surface of the second piezo-electric element.

11. The bendable apparatus of claim 1, wherein the flexible material includes a plurality of dither reeds arranged in conjunction with a respective plurality of gyroscopes.

12. A method of forming a bendable apparatus, the method comprising:
    forming a flexible material having a length in a first direction, a width in a second direction, and a thickness in a third direction, wherein the length and the width are larger than the thickness, the flexible material having a first-surface spanned by the first direction and the second direction;

forming a first-constraining surface in the flexible material, wherein the first-constraining surface is at least approximately perpendicular to the first-surface of the flexible material; and fixedly attaching a piezo-electric element, which includes a first-edge surface and a second-edge surface opposing the first-edge surface, to the first-surface of the flexible material, wherein the first-edge surface of the piezo-electric element is adjacent to the first-constraining surface, wherein the first-edge surface and the second-edge surface are at least approximately perpendicular to the first-surface of the flexible material, and wherein, when a voltage is applied to the piezo-electric element, the piezo-electric element expands in length, the first-edge surface of the piezo-electric element applies a force on the first-constraining surface, and the flexible material bends.

13. The method of claim 12, further comprising:
filling a gap between the first-constraining surface and the first-edge surface with filler.

14. The method of claim 12, further comprising:
forming a second-constraining surface opposing the first-constraining surface, wherein the second-constraining surface is at least approximately perpendicular to the first-surface of the flexible material, wherein the second-constraining surface is adjacent to the second-edge surface of the piezo-electric element, and wherein, when the voltage is applied to the piezo-electric element, the second-edge surface of the piezo-electric element applies another force on the second-constraining surface, and the flexible material bends further.

15. The method of claim 14, wherein the piezo-electric element is a first piezo-electric element having a first-positive side and a first-negative side opposing the first-positive side, wherein fixedly attaching the piezo-electric element to the first-surface of the flexible material comprises fixedly attaching the first-negative side of the first piezo-electric element to the first-surface of the flexible material, the method further comprising:

forming a third-constraining surface in a second-surface of the flexible material, wherein the third-constraining surface is at least approximately perpendicular to the second-surface of the flexible material; and fixedly attaching a second piezo-electric element to the second-surface of the flexible material, wherein the second piezo-electric element includes: a third-edge surface and a fourth-edge surface opposing the third-edge surface; and a second-positive side and a second-negative side opposing the second-positive side, wherein the third-edge surface of the second piezo-electric element is adjacent to the third-constraining surface, wherein the second-positive side of the second piezo-electric element is fixedly attached on the second-surface of the flexible material, and wherein, when the voltage is applied to the second piezo-electric element, the second piezo-electric element contracts in length.

16. The method of claim 15, further comprising:
forming a fourth-constraining surface opposing the third-constraining surface, wherein the fourth-constraining surface is at least approximately perpendicular to the second-surface of the flexible material, wherein the fourth-constraining surface is adjacent to the fourth-edge surface of the second piezo-electric element fixedly attached to the second-surface of the flexible material.

17. The method of claim 12, wherein the piezo-electric element is a first piezo-electric element having a first-positive side and a first-negative side opposing the first-positive side, wherein fixedly attaching the piezo-electric element to the first-surface of the flexible material comprises fixedly attaching the first-negative side of the first piezo-electric element to the first-surface of the flexible material, the method further comprising:

fixedly attaching a second piezo-electric element to a second-surface of the flexible material, wherein the second piezo-electric element includes: a first-edge surface and a second-edge surface opposing the first-edge surface; and a second-positive side and a second-negative side opposing the second-positive side, wherein the second-positive side of the second piezo-electric element is fixedly attached on the second-surface of the flexible material, and wherein, when the voltage is applied to the second piezo-electric element, the second piezo-electric element contracts in length.

18. The method of claim 17, further comprising:
filling a first gap between the first-constraining surface and the first-edge surface of the first piezo-electric element;

filling a second gap between the second-constraining surface and the second-edge surface of the of the first piezo-electric element;

filling a third gap between the third-constraining surface and the third-edge surface of the second piezo-electric element; and filling a third gap between the third-constraining surface and the fourth-edge surface of the second piezo-electric element.

19. A bendable apparatus comprising:
a flexible material having a length in a first direction, a width in a second direction, and a thickness in a third direction, wherein the length and the width are larger than the thickness, the flexible material having a first-surface spanned by the first direction and the second direction and a second-surface spanned by the first direction and the second direction;

a first-constraining surface one of: formed in the first-surface of the flexible material; or attached to the first-surface of the flexible material;

a second-constraining surface opposing the first-constraining surface, the second-constraining surface one of: formed in the first-surface of the flexible material; or attached to the first-surface of the flexible material;

a third-constraining surface one of: formed in the second-surface of the flexible material; or attached to the second-surface of the flexible material;

a fourth-constraining surface one of: formed in the second-surface of the flexible material; or attached to the second-surface of the flexible material;

a first piezo-electric element including a first-edge surface and a second-edge surface opposing the first-edge surface, and including a first-positive side and a first-negative side opposing the first-positive side, the first-negative side of the first piezo-electric element fixedly attached on the first-surface of the flexible material, so that:

the first-edge surface and the second-edge surface are at least approximately perpendicular to the first-surface of the flexible material, and the first-constraining surface is adjacent to the first-edge surface of the first piezo-electric element, and the second-constraining surface is adjacent to the second-edge surface of the first piezo-electric element; and a second piezo-electric element including a third-edge surface and a fourth-edge surface opposing the third-edge surface, and including a second-positive side and a second-negative side opposing the second-positive side, the second-positive side fixedly attached on the second-surface of the flexible material, so that:

the third-edge surface and the fourth-edge surface are at least approximately perpendicular to the second-surface of the flexible material, and the third-constraining surface is adjacent to the third-edge surface of the second piezo-electric element, and the fourth-constraining surface is adjacent to the fourth-edge surface of the second piezo-electric element wherein, when a voltage is applied to the first piezo-electric element and the second piezo-electric element, the first piezo-electric element expands in length and the second piezo-electric element contracts in length, wherein the first-edge surface of the piezo-electric element applies a first force on the first-constraining surface, the second-edge surface of the piezo-electric element applies a second force on the second-constraining surface, and wherein the applied voltage causes the flexible material to bend.

20. The bendable apparatus of claim 19, further comprising:

filler filling a first gap between the first-constraining surface and the first-edge surface of the first piezo-electric element;

filler filling a second gap between the second-constraining surface and the second-edge surface of the of the first piezo-electric element;

filler filling a third gap between the third-constraining surface and the third-edge surface of the second piezo-electric element; and filler filling a fourth gap between the fourth-constraining surface and the fourth-edge surface of the second piezo-electric element.

* * * * *